United States Patent [19]

Hosoda et al.

[11] Patent Number: 4,860,299
[45] Date of Patent: Aug. 22, 1989

[54] SEMICONDUCTOR LASER DEVICE

[75] Inventors: Masahiro Hosoda, Nara; Kazuaki Sasaki, Yao; Masaki Kondo, Tenri; Saburo Yamamoto, Nara, all of Japan

[73] Assignee: Sharp Kabushiki Kaisha, Osaka, Japan

[21] Appl. No.: 195,069

[22] Filed: May 17, 1988

[30] Foreign Application Priority Data

May 19, 1987 [JP] Japan ................. 62-121668

[51] Int. Cl.$^4$ .............................. H01S 3/19
[52] U.S. Cl. ........................ 372/46; 372/48
[58] Field of Search ............... 372/46, 50, 48

[56] References Cited

U.S. PATENT DOCUMENTS

| 4,366,569 | 12/1982 | Hirao et al. | 372/46 |
|---|---|---|---|
| 4,416,012 | 11/1983 | Botez et al. | 372/45 |
| 4,480,331 | 10/1984 | Thompson | 372/45 |
| 4,512,022 | 4/1985 | Tsang | 372/45 |
| 4,573,161 | 2/1986 | Sakai et al. | 372/45 |
| 4,602,371 | 7/1986 | Kawauo et al. | 372/46 |
| 4,631,802 | 12/1986 | Hayashi et al. | 372/45 |
| 4,635,268 | 1/1987 | Motegi et al. | 372/45 |
| 4,730,329 | 3/1988 | Yoshida et al. | 372/46 |
| 4,745,612 | 5/1988 | Hayakawa et al. | 372/45 |
| 4,750,183 | 6/1988 | Takahashi et al. | 372/45 |
| 4,757,510 | 7/1988 | Kaneno et al. | 372/45 |

FOREIGN PATENT DOCUMENTS

| 0044571 | 1/1982 | European Pat. Off. . |
|---|---|---|
| 0125738 | 11/1984 | European Pat. Off. . |
| 0198656 | 1/1986 | European Pat. Off. . |
| 0206496 | 12/1986 | European Pat. Off. . |
| 0209387 | 1/1987 | European Pat. Off. . |
| 0210616 | 2/1987 | European Pat. Off. . |
| 0215298 | 3/1987 | European Pat. Off. . |
| 8418900 | 6/1986 | France . |
| 59-48976 | 3/1984 | Japan . |
| 61-207090 | 9/1986 | Japan . |
| 63-93183 | 4/1988 | Japan . |
| 1378128 | 12/1974 | United Kingdom . |
| 2100501A | 12/1982 | United Kingdom . |

OTHER PUBLICATIONS

Patent Abstracts of Japan (Nov. 22, 1984) 8(256), E-280, 1693, appl. No. 59-127893.
Kurobe et al., (1986) Electronics Letters 22(21):1117-1118.
Hayakawa et al. (1986) Appied Physics Letters 49(11); 636-638.
Patent Abstracts of Japan (Nov. 29, 1985) 9(302), E-362, 2025, appl. No. 58-250138.
Patent Abstracts of Japan (Jun. 28, 1984) 8(139), E-253, 1576, appl. No. 57-160054.
Smith, Jul./Aug. 1986, Xerox Disclosure Journal 11(4):151-152.
Okajima et al., *Japanese J. Appl. Phys.* (1982) 21:353-358.
van der Ziel et al., *IEEE J. Quantum Electronics* (1985) QE-21:1659-1665.
"Institute Electronics, Information and Communication Engineers of Japan", vol. OQE86-155, pp. 69-74.
J. Appl. Phys. 61(8), Apr. 15, 1987, pp. 3108-3110.

*Primary Examiner*—James W. Davie
*Attorney, Agent, or Firm*—Irell & Manella

[57] ABSTRACT

A semiconductor laser device comprising a substrate; a current blocking layer disposed on the substrate; a striped channel formed in a manner to reach the substrate through the current blocking layer; a striped mesa disposed on the area of the V-channel, the striped mesa being of a multi-layered crystal that is composed of a first cladding layer, an active layer, a second cladding layer, and a protective layer in that order; and burying layers having at least one of the following two, a pn-reverse bias junction and a high resistant crystal, the burying layer being formed on both sides of the striped mesa, wherein the protective layer is made of $Ga_{1-x}Al_xAs$ ($x>0$).

4 Claims, 3 Drawing Sheets

SEMICONDUCTOR LASER DEVICE

BACKGROUND OF THE INVENTION

1. Field of the Invention

This invention relates to an index guided semiconductor laser device that attains laser oscillation at an extremely low threshold current level.

2. Description of the Prior Art

Conventional semiconductor laser devices are classified into two groups, gain-guided semiconductor laser devices and index guided semiconductor laser devices, according to their optical waveguiding mechanism. Index guided semiconductor laser devices are superior to gain-guided semiconductor laser devices in view of transverse mode stabilization that is important in practical use. Index guided semiconductor laser devices having a variety of structures have been proposed, typical examples of which are BH (buried heterostructure) lasers and VSIS (V-channeled substrate inner stripe) lasers.

FIG. 2 shows a conventional BH laser device, in which a double-heterostructure with a laser-oscillating active layer 24 sandwiched between the cladding layers 23 and 25 is formed into a mesa on a substrate 21 and a burying layer 27 having a low refractive index is buried outside the mesa. The BH laser device oscillates a laser beam according to an index waveguiding operation and has a low threshold current of 10 mA or less. However, if a proper refractive index is not applied to the burying layer 27 and if a proper width w is not applied to the waveguide, the device will oscillate in a high-order transverse mode. Thus, the BH laser device is disadvantageous in that it is restricted by production conditions. Moreover, in order for the BH laser device to oscillate in a fundamental transverse mode, the width of the waveguide must be set to be 2 μm or less, which causes breakdown of the facets at a relatively low output power level, so that mass-production of the device cannot be attained and reliability of the device is decreased. The reference numeral 26 is a cap layer by which ohmic contact is achieved.

FIG. 3 shows a conventional VSIS laser device, which is produced as follows: On a substrate 31, a current blocking layer 32 is disposed. Then, a striped V-channel 30 with the width w is formed in such a way that it reaches the substrate 31 through the current blocking layer 32, resulting in a current path. Then, on the current blocking layer 32 including the V-channel 30, a cladding layer 33, a flat active layer 34, and a cladding layer 35 are successively formed, resulting in a double-heterostructure multi-layered crystal for laser oscillation operation. Even when the width w of the waveguide is set at a value of as large as 4–7 μm, since a laser beam outside of the wave guide within the active layer 34 is absorbed by the substrate 31, high-order mode gain is suppressed and a high-order transverse mode does not occur. However, the threshold current of this VSIS laser device is 40–60 mA, which is extremely higher than that of the BH laser device. This is because current injected into the device is confined within the inner striped structure formed by the current blocking layer 32, but carrier injected into the active layer 34 diffuses into the outside of the active layer 34, resulting in carrier unusable for laser oscillation. The unusable carrier results in unnecessary light and/or generates unnecessary heat, causing an increase in the threshold current of the device and a decrease in reliability of the device.

To overcome the problems of both the BH laser device and the VSIS laser device, as shown in FIG. 4A, a structure of semiconductor laser devices in which grooves are formed on both sides of the V-channel of the VSIS laser device from the protective layer 6 to the current blocking layer 2 by an etching technique and subsequently filled with a multi-layered crystal having a reverse bias junction has been proposed. This semiconductor laser device is produced as follows: On a p-GaAs substrate 1, an n-current blocking layer 2 is formed, and then a striped V-channel 10 is formed in such a way that it reaches the p-GaAs substrate 1 through the current blocking layer 2. On the current blocking layer 2 including the V-channel, a p-cladding layer 3, an active layer 4, an n-cladding layer 5, and an n-GaAs protective layer 6 is successively formed. Then, grooves are formed on both sides of the area including V-channel 10, resulting in a striped mesa 11. The grooves are filled with a $p^{-}$-type first burying layer 7 and a p-type second burying layer 8. A cap layer 9 by which ohmic contact is attained is formed on both the n-GaAs protective layer 6 and the second burying layer 8. This semiconductor laser device is advantageous in that carrier injected into the active layer 4 only diffuses within the striped mesa 11 and moreover a laser beam produced in the active layer is absorbed by the area outside of the striped channel of the n-current blocking layer, resulting in a suppression of the occurrence of a high-order mode. However, there is a difference in the crystal growth rate between the burying layers, so that the thicknesses of the burying layers of the reverse bias injunction portion, i.e., the thicknesses of the $p^{-}$-type burying layer 7 and the p-type burying layer 8, in the area 12 at a distance from the striped mesa 11 become equal to the range of the carrier diffusion or less. Thus, there is a possibility that, as shown in FIG. 4A, leakage current $I_L$ flows from the mesa to the burying area outside of the mesa, resulting in a limitation of the decrease in the threshold current. When the crystal growth period is enlarged so as to obtain sufficiently thick layer thicknesses, as shown in FIG. 4B, a multi-layered crystal having a pn-reverse bias junction is grown on the mesa 11, whereby a flow of current that contributes to laser oscillation is prevented, causing a decrease in the device characteristics.

SUMMARY OF THE INVENTION

The semiconductor laser device of this invention, which overcomes the above-discussed and numerous other disadvantages and deficiencies of the prior art, comprises a substrate; a current blocking layer disposed on said substrate; a striped channel formed in a manner to reach said substrate through said current blocking layer; a striped mesa disposed on the area of said V-channel, said striped mesa being of a multi-layered crystal that is composed of a first cladding layer, an active layer, a second cladding layer, and a protective layer in that order; and burying layers having at least one of the following two, a pn-reverse bias junction and a high resistant crystal, said burying layer being formed on both sides of said striped mesa, wherein said protective layer is made of $Ga_{1-x}Al_xAs$ ($x>0$).

In a preferred embodiment, the value of x is in the the range of about 0.03 to 0.60.

Thus, the invention described herein makes possible the objectives of (1) providing a semiconductor laser device in which the surface of the striped mesa is made of a crystal containing Al, and accordingly even though sufficiently thick burying layers having a pn-reverse bias junction and/or a high resistant crystal are grown outside of the mesa, they are not grown on the mesa, so that leakage current can be remarkably suppressed, resulting in a decrease in the threshold current; and (2) providing a semiconductor laser device that attains laser oscillation in a stabilized fundamental transverse mode up to a high optical output.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The liquid phase epitaxial growth of crystals on a crystal containing Al is in fact suppressed. Since the protective layer of a semiconductor laser device of this invention that is an epilayer of the mesa is made of a ternary mixed crystal of $Ga_{1-x}Al_xAs$ (x>0), the growth of burying layers on the mesa is prevented even when the growth period is enlarged, so that the portions of the burying layers at a distance from the mesa can be made thick enough to suppress any occurrence of leakage current. Accordingly, the effective flow of current that distributes to laser oscillation is achieved, resulting in excellent device characteristics. Moreover, since the thicknesses of the burying layers can be made large, the scatter of the layer thicknesses within the wafer is minimized, which results in an improvement of the production yield of the laser device.

EXAMPLE

Figure 1:
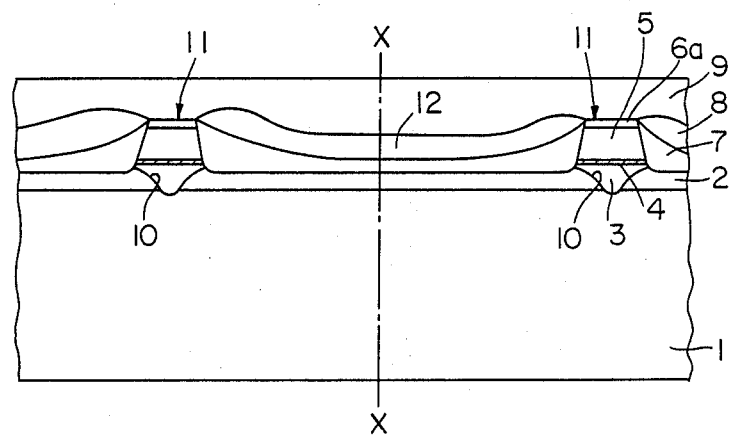
FIG. 1 is a front view showing a semiconductor laser device of this invention.
Figure 2:
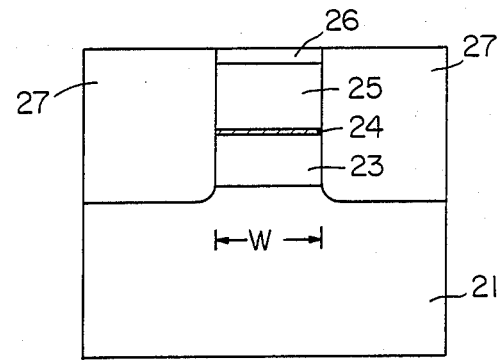
FIG. 2 is a front view showing a conventional BH laser device.
Figure 3:
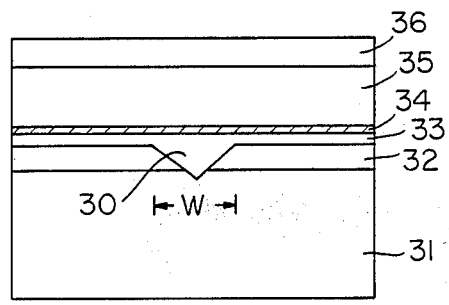
FIG. 3 is a front view showing a conventional VSIS laser device.
Figure 4A:
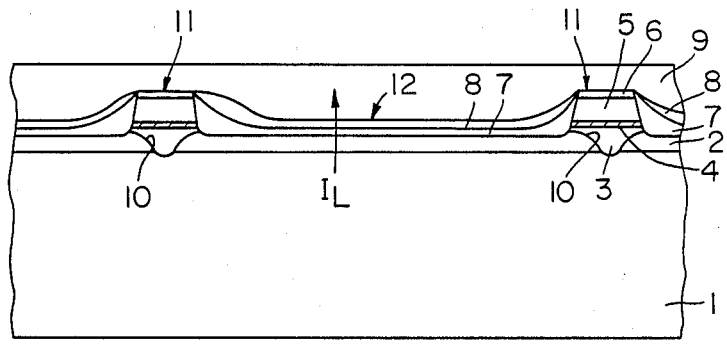
FIG. 4A is a front view showing a conventional semiconductor laser device with a structure in which the outside of the V-channel area of a VSIS laser is buried by a thin multi-layered crystal.
Figure 4B:
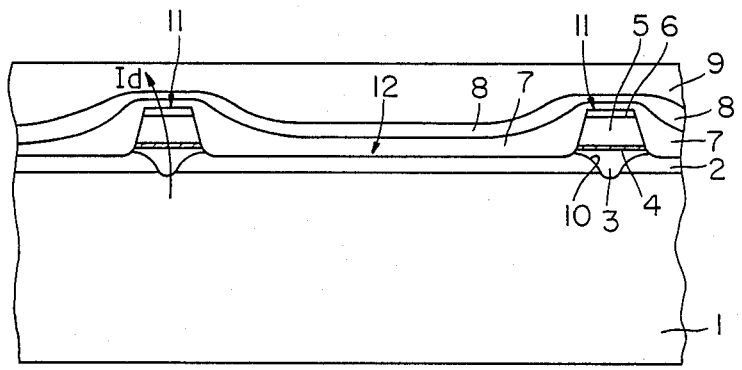
FIG. 4B is a front view showing a conventional semiconductor laser device with a structure in which the outside of the V-channel area of a VSIS laser is buried by a thick multi-layered crystal.

FIG. 1 shows a semiconductor laser device of this invention, which comprises a p-GaAs substrate 1, an n-GaAs current blocking layer 2 disposed on the substrate, a striped channel 10 formed in a manner to reach the substrate 1 through the current blocking layer 2, and a striped mesa 11 disposed on the area of the V-channel 10. The striped mesa 11 is constituted by a multi-layered crystal that is composed of a p-$Ga_{0.55}Al_{0.45}As$ first cladding layer 3, a non-doped $Ga_{0.88}Al_{0.12}As$ active layer 4, an n-$Ga_{0.55}Al_{0.45}As$ second cladding layer 5, and an n-$Ga_{0.80}Al_{0.20}As$ protective layer 6a in that order. A p$^-$-$Ga_{0.15}Al_{0.85}As$ high resistant burying layer 7 as a first burying layer and a p-$Ga_{0.85}Al_{0.15}As$ burying layer 8 as a second burying layer are buried outside of the striped mesa 11. On both the n-$Ga_{0.80}Al_{0.20}As$ protective layer 6a and the p-$Ga_{0.85}Al_{0.15}As$ burying layer 8, an n-type cap layer 9 by which ohmic contact is attained is formed.

This semiconductor laser device is produced as follows: On a p-GaAs substrate 1, an n-GaAs current blocking layer 2 is formed by liquid phase epitaxy (LPE). Then, a V-channel 10 is formed in such a way that it reaches the p-GaAs substrate 1 through the current blocking layer 2 by a photolithographic technique. Then, on the current blocking layer 2 including the V-channel 10, a p-$Ga_{0.55}Al_{0.45}As$ cladding layer 3, a non-doped $Ga_{0.88}Al_{0.12}As$ active layer 4 with a thickness of 0.08 μm, an n-$Ga_{0.55}Al_{0.45}As$ cladding layer 5, and an n-$Ga_{0.80}Al_{0.20}As$ protective layer 6a are successively formed by LPE. Thereafter, the outside of the multi-layered crystal positioned over the V-channel 10 is removed from the protective layer 6a to the cladding layer 3 by an etching technique using an etchant ($H_2SO_4$:$H_2O_2$:$H_2O$=2:4:100), resulting in a striped mesa 11 on the V-channel 10. When the outside of the multi-layered crystal positioned over the V-channel 10 is removed in such a way that it reaches the current blocking layer 2, the succeeding growth of crystals in the removed area can be carried out by LPE.

Then, a p$^-$-$Ga_{0.15}Al_{0.85}As$ high resistant burying layer 7 (containing Ge as an acceptor) as a first burying layer and a p-$Ga_{0.85}Al_{0.15}As$ burying layer 8 as a second burying layer are successively formed outside of the mesa 11 by LPE. The n-$Ga_{0.80}Al_{0.20}As$ protective layer 6a is positioned as an epilayer on the top surface of the mesa 11, that is, the crystal containing Al is exposed to the outside, which causes a suppression of the succeeding crystal growth thereon. Thus, so that the occurrence of leakage current $I_L$ in the area at a distance from the mesa 11 can be prevented, even though the formation of the first and second burying layers 7 and 8 with a sufficient thickness each in the range of 0.5 to 1 μm are intended, these layers are not grown on the mesa 11 but they are grown outside of the mesa 11. On the other hand, an n-GaAs cap layer 9 by which ohmic contact is attained is grown not only on the second burying layer 8 but also on the mesa 11 by enlarging the crystal growth period, resulting in a wafer with a flat surface. An n-sided electrode and a p-sided electrode are formed on the upper face of the grown layer 9 and the back face of the substrate 1, respectively. The wafer is then cleaved along x-x line, resulting in a semiconductor laser device. Because of the flat surface of the wafer, a junction down-type mounting can be readily carried out.

Since the above-mentioned semiconductor laser device has the sufficiently thick burying layers 7 and 8 positioned outside of the mesa 11, leakage current $I_L$ never occurs even in the area 12 at a distance from the mesa 11. Therefore, carrier injected into the laser device contributes to a light emission, which results in a remarkable decrease in the threshold current level, 21 mA (when the internal cavity length is 250 μm). The oscillation wavelength attained by this laser device was 780 nm. This laser device also oscillated a laser beam in a stabilized fundamental transverse mode up to 30 mW optical output power at continuous oscillation operation.

This invention is disadvantageous in that when the AlAs mole fraction x of the n-$Ga_{1-x}Al_xAs$ protective layer 6a is less than 0.03 (i.e., x<0.03), the first and second burying layers 7 and 8 can be grown on the mesa 11, which causes a decreases in the production yield of the laser device and that when the value of x is greater than 0.60 (i.e., x>0.60), the discontinuity in the cap layer 9 arises on the mesa 11 and/or the crystal quality of the cap layer 9 deteriorates. Thus, the value of x must be set to be in the range of about 0.03 to 0.60 (i.e., $0.03 \lesssim x \lesssim 0.60$).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a substrate; a current blocking layer disposed on said substrate; a striped channel formed in a manner to reach said substrate through said current blocking layer; a striped mesa disposed on the area of said striped channel, said striped mesa being of a multi-layered crystal that is composed of a first cladding layer, an active layer, a second cladding layer, and a protective layer in that order; and burying layers, wherein said protective layer is made of $Ga_{1-x}Al_xAs$ (x>0) and said burying layers are made of $Ga_{1-y}Al_yAs$ (y>0), whereby said burying layers are not formed on said striped mesa but they are formed on both sides of said striped mesa and the thickness of said burying layers positioned outside of said striped mesa becomes large enough to prevent the occurrence of leakage current even in the burying layer area at a distance from said striped mesa.

2. A semiconductor laser device according to claim 1, wherein the value of x is in the range of about 0.03 to 0.60.

3. A semiconductor laser device according to claim 1, wherein said burying layer has a pn-reverse bias junction.

4. A semiconductor laser device according to claim 1, wherein said burying layer has a high resistance crystal.

* * * * *